(12) United States Patent
Noguchi

(10) Patent No.: US 7,579,688 B2
(45) Date of Patent: Aug. 25, 2009

(54) HEAT RADIATION STRUCTURE OF SEMICONDUCTOR DEVICE, AND MANUFACTURING METHOD THEREOF

(75) Inventor: Takashi Noguchi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 10/822,691

(22) Filed: Apr. 13, 2004

(65) Prior Publication Data

US 2004/0207075 A1 Oct. 21, 2004

(30) Foreign Application Priority Data

Apr. 16, 2003 (JP) ............... 2003-111182
Mar. 30, 2004 (JP) ............... 2004-100442

(51) Int. Cl.
*H01L 23/10* (2006.01)
*H01L 23/34* (2006.01)

(52) U.S. Cl. ............. 257/712; 257/706; 257/707; 257/704; 257/730; 438/122; 438/125

(58) Field of Classification Search ........ 257/706, 257/712, E23.103, E23.105, E23.111, E23.127, 257/E23.18, 776–778, 707, 704, 730; 438/122, 438/125, 108
See application file for complete search history.

(56) References Cited

U.S. PATENT DOCUMENTS

| | | | | |
|---|---|---|---|---|
| 5,168,348 A * | 12/1992 | Chu et al. | ............. | 257/713 |
| 5,866,943 A * | 2/1999 | Mertol | ............. | 257/712 |
| 6,114,763 A * | 9/2000 | Smith | ............. | 257/738 |
| 6,194,778 B1 * | 2/2001 | Ohsawa et al. | ............. | 257/668 |
| 6,228,466 B1 | 5/2001 | Tsukada et al. | | |
| 6,504,096 B2 * | 1/2003 | Okubora | ............. | 174/52.2 |
| 6,552,266 B2 * | 4/2003 | Carden et al. | ............. | 174/52.4 |
| 6,703,704 B1 * | 3/2004 | Alcoe et al. | ............. | 257/688 |
| 6,791,195 B2 * | 9/2004 | Urushima | ............. | 257/783 |
| 2002/0063331 A1 * | 5/2002 | Honda | ............. | 257/737 |
| 2002/0145194 A1 * | 10/2002 | O'Connor et al. | ............. | 257/712 |
| 2003/0037866 A1 * | 2/2003 | Aoki et al. | ............. | 156/230 |
| 2004/0188813 A1 * | 9/2004 | Agraharam et al. | ............. | 257/678 |

FOREIGN PATENT DOCUMENTS

| | | |
|---|---|---|
| JP | 11-54896 | 2/1999 |
| JP | 11-67998 | 3/1999 |
| JP | 10-125834 | 5/2001 |
| JP | 2001-250872 | 9/2001 |
| JP | 2002-329939 | 11/2002 |
| JP | 2003-51572 | 2/2003 |

* cited by examiner

*Primary Examiner*—Kenneth A Parker
*Assistant Examiner*—Joseph Nguyen
(74) *Attorney, Agent, or Firm*—Rabin & Berdo, P.C.

(57) ABSTRACT

The invention of the present application provides a heat radiation structure of a semiconductor device, and includes a substrate having, on a surface thereof, a first area on which the semiconductor device is mounted, and a second area which surrounds the first area. The semiconductor device has a first surface and a second surface opposite to the first surfaces, and is formed with a plurality of terminals provided on the first surface. The semiconductor device is mounted on the substrate in such a manner that the first surface is opposite to the surface of the substrate. A first heat radiating film is formed on the second area of the substrate, and a second heat radiating film is formed on the second surface of the semiconductor device, with the second heat radiating film being spaced apart from the first heat radiating film.

26 Claims, 6 Drawing Sheets

HEAT RADIATION STRUCTURE OF SEMICONDUCTOR DEVICE, AND MANUFACTURING METHOD THEREOF

BACKGROUND OF THE INVENTION

1. Field of the Invention

The present invention relates to a heat radiation structure of a semiconductor device, which is high in radiating effect and adapts to its thinning, and a method of manufacturing the same.

2. Description of the Related Art

Several proposals have heretofore been made as heat radiation structures each suitable for a semiconductor device mounted on a substrate. As one of them, there is known a structure wherein a high-heat conductive resin is applied onto a substrate with a semiconductor device flip-chip packaged thereon by use of printing or a dispenser or the like so as to cover the semiconductor device, and the high-heat conductive resin is caused to conduct heat generated from the semiconductor device, thereby carrying out heat radiation (see, for example, the following patent document 1).

Patent Document 1

Japanese Unexamined Patent Publication No. Hei 10(1998)-125834

However, the high-heat conductive resin is formed so as to continuously cover the upper surface of the semiconductor device and the upper surface of the substrate in the prior art disclosed in the patent document 1. Therefore, the prior art has a possibility that when the high-heat conductive resin is deformed due to a change in temperature or the like in a heat-treating or annealing step of a manufacturing process and under the environment that it is actually used as a product, a difference occurs in deformation of the high-heat conductive resin at the interface with the semiconductor device and the interface with the substrate where the semiconductor device and the substrate are different in thermal expansion coefficient, and hence stress developed due to the difference in deformation is concentrated on part of the high-heat conductive resin, so that cracks will occur in the high-heat conductive resin, and a possibility that the high-heat conductive resin will be peeled from the semiconductor device or the substrate, thus causing a possibility that sufficient heat radiation will not be carried out.

SUMMARY OF THE INVENTION

The present invention has been made to solve the foregoing problems. According to one aspect of the present invention, there is provided a heat radiation structure of a semiconductor device, comprising:

a substrate having, on a surface thereof, a first area on which the semiconductor device is mounted, and a second area which surrounds the first area; and the semiconductor device having a first surface and a second surface opposite to the first surface, and formed with a plurality of terminals provided on the first surface, wherein the semiconductor device is mounted on the substrate in such a manner that the first surface is opposite to the surface of the substrate, and wherein a first heat radiating film is formed on the second area of the substrate, and a second heat radiating film is formed on the second surface of the semiconductor device with being spaced away from the first heat radiating film.

According to a typical invention of the present application, a heat radiation structure of a semiconductor device can be provided which is capable of adapting to its thinning and obtaining a high heat radiating effect.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Figure 1:
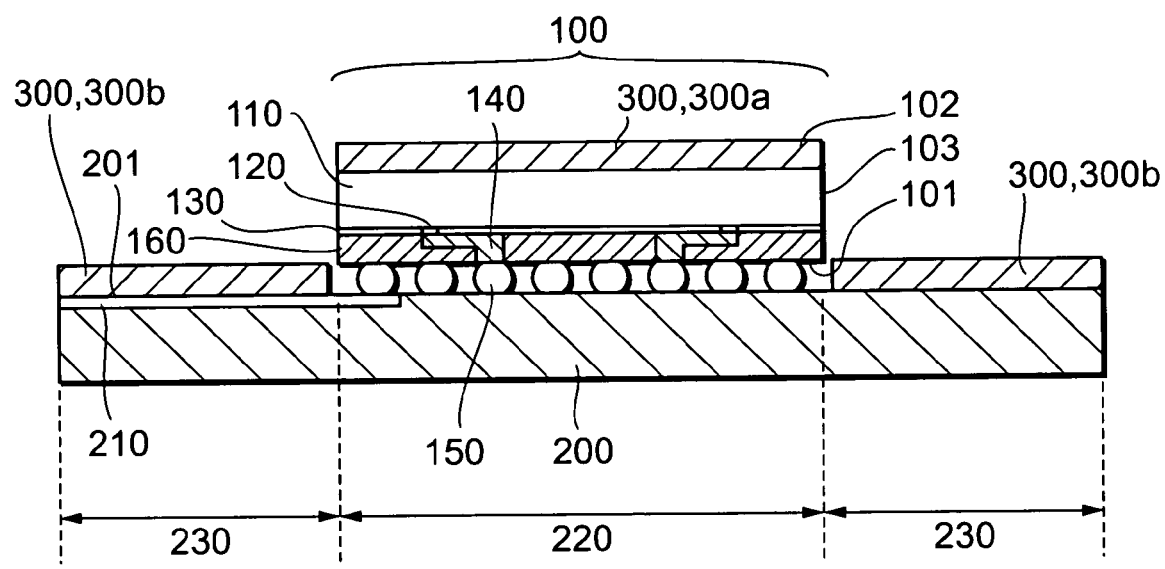
FIG. 1 is a cross-sectional view for describing a heat radiation structure of a semiconductor device according to a first embodiment of the present invention.

A first heat or thermal emission film with ceramics as the material is formed on a second area of a substrate. A second heat or thermal emission film with ceramics as the material is formed on a second surface of a semiconductor device with being spaced away from the first thermal emission film.

Preferred embodiments of the invention of the present application will hereinafter be described in detail with reference to the accompanying drawings. Elements of structure similar throughout all the drawings are respectively identified by like reference numerals.

Figure 2:
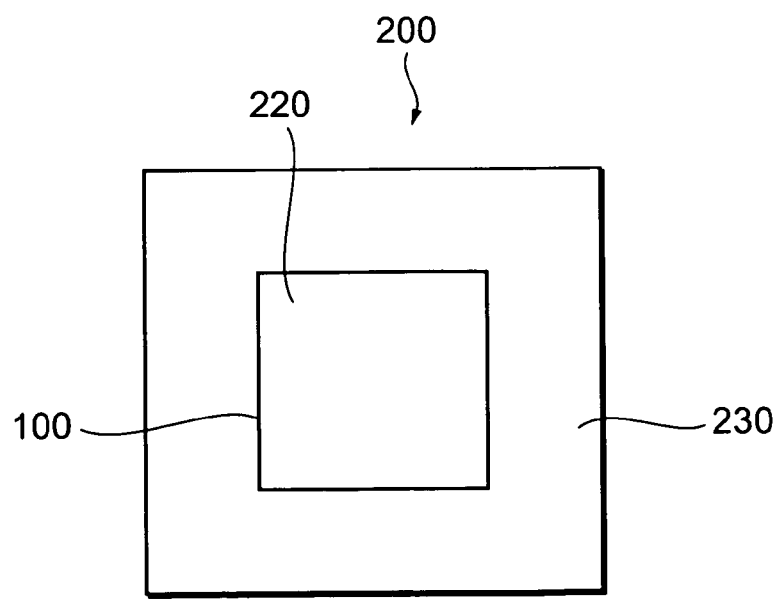
FIG. 2 is a plan view for describing the heat radiation structure of the semiconductor device according to the first embodiment.
Figure 3:
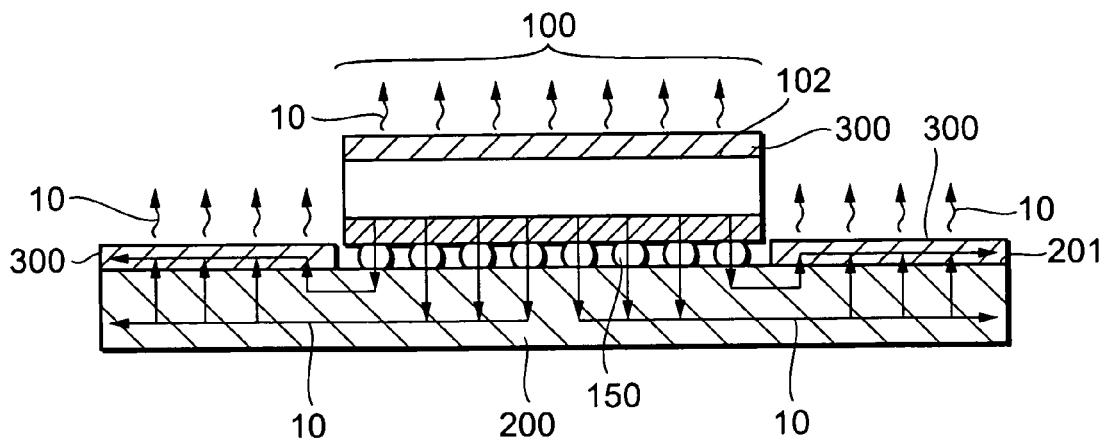
FIG. 3 is a cross-sectional view for describing the manner of heat radiation from the heat radiation structure of the semiconductor device according to the first embodiment.
Figure 4:
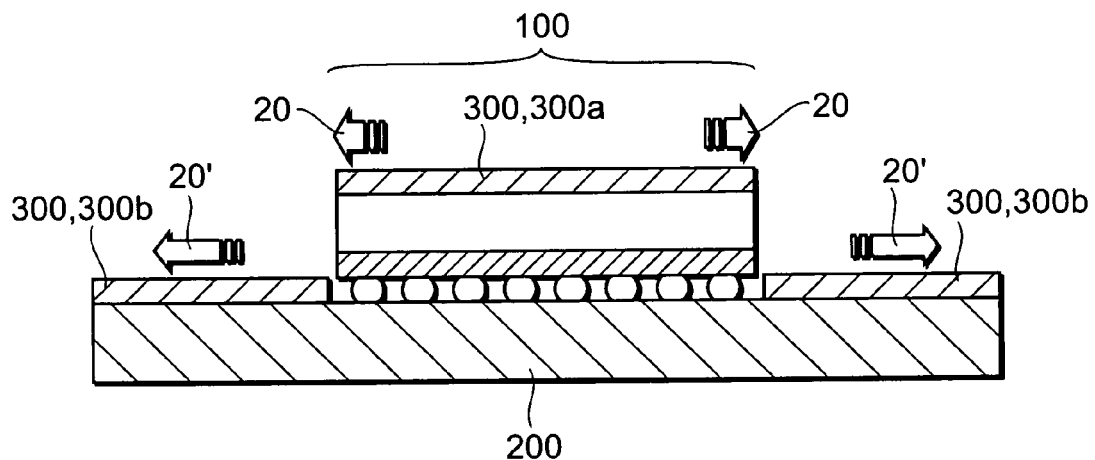
FIG. 4 is a cross-sectional view for describing the manner of deformation of a heat radiating film employed in the heat radiation structure of the semiconductor device according to the first embodiment.
Figure 5:
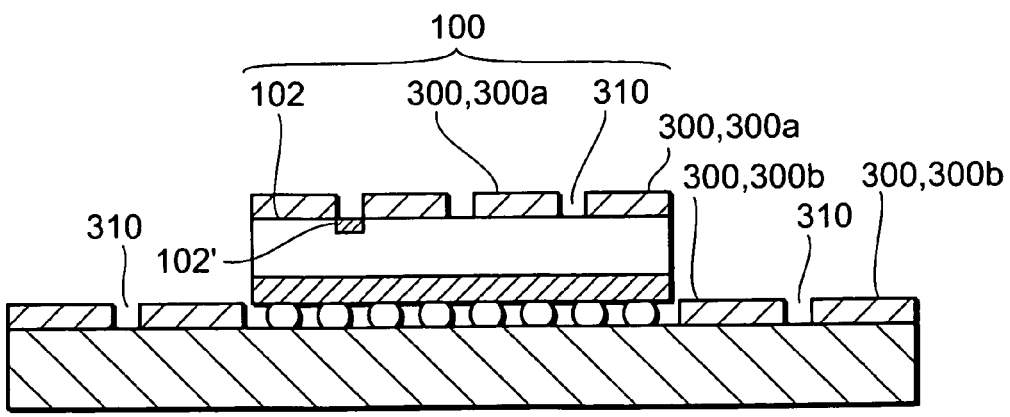
FIG. 5 is a cross-sectional view for describing a modification of the heat radiation structure of the semiconductor device according to the first embodiment.

FIG. 1 is a cross-sectional view showing a heat radiation structure of a semiconductor device according to a first embodiment of the invention of the present application, and FIG. 2 is a plan view thereof, respectively. FIG. 3 is a cross-sectional view showing the manner of heat transfer of the heat radiation structure of the semiconductor device according to the present embodiment. FIG. 4 is a cross-sectional view showing the manner of deformation of a heat radiating film employed in the heat radiation structure of the semiconductor device according to the present embodiment. FIG. 5 is a cross-sectional view showing the heat radiation structure of the semiconductor device, according to a modification of the present embodiment.

As shown in FIG. 1, the heat radiation structure of the semiconductor device according to the first embodiment of the invention of the present application includes a substrate 200 on which the semiconductor device 100 is mounted. A wiring 210 electrically connected to the mounted semiconductor device 100 is provided in the surface 201 of the substrate 200. Owing to the wiring 210, the semiconductor device 100 is electrically connected to other electronic parts and the like packaged on the substrate 200.

Figure 14:
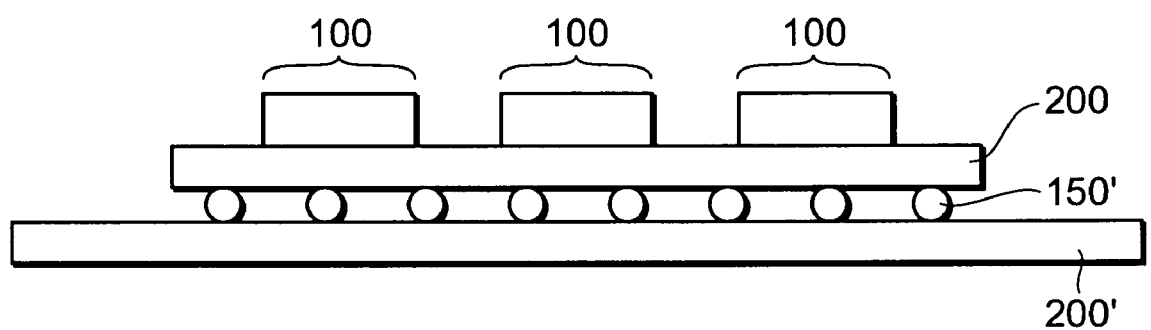
FIG. 14 is a cross-sectional view showing a modification of the heat radiation structure of the semiconductor device according to the first embodiment.

The invention of the present application can be applied even to a case in which the substrate 200 is a board or substrate (called also "interposer substrate") on which as shown in FIG. 14, the semiconductor device 100 is mounted in plural form and external electrodes 150' connected to an external board 200' such as a printed circuit board is provided. In this case, the semiconductor devices 100 are not directly mounted on the mounting board 200'. They are first mounted on the substrate 200. Thereafter, the substrate 200 with the semiconductor devices 100 mounted thereon is connected to the mounting board 200' through the external electrodes 150'. In the present embodiment, the material for the external electrodes 150' is solder and the external electrodes 150' are provided on the back surface of the substrate 200.

As shown in FIGS. 1 and 2, the substrate 200 includes an area 220 in which the semiconductor device 100 is mounted, and an area 230 which surrounds the area 220, i.e., an area 230 exposed from the semiconductor device 100.

The semiconductor device 100 is mounted over the surface 201 of the substrate 200. In the present embodiment, the semiconductor device 100 includes a first surface 101 on which a plurality of terminals 150 electrically connected to the substrate 200 are formed, a second surface 102 opposite to the first surface 101, and side surfaces 103 as shown in FIG. 1. Here, the semiconductor device 100 may be a packaged semiconductor element 110 or an unpackaged semiconductor element 110.

In the present embodiment, the semiconductor device 100 makes use of the packaged semiconductor element 110. As the package, a wafer level chip size package (hereinafter called "WCSP") is used. A description will now be made of the WCSP. The packaging is adopted such that a wafer formed with a plurality of semiconductor elements is sealed with a resin in a wafer state and thereafter the wafer is cut to divide it into semiconductor elements. The packaging is characterized in that the size of each semiconductor element and the size of each package are almost identical to each other. Attention has recently been given to it as a package adaptable to the demand for a reduction in size.

That is, the semiconductor device 100 according to the present embodiment has a semiconductor element 110 whose surface is formed with an electronic circuit. A plurality of electrodes 120 electrically connected to the electronic circuit are formed on the surface thereof. Further, a protective film 130 such as a polyimide resin or the like is formed on the surface of the semiconductor element 110 such that the surfaces of the electrodes 120 are exposed. Wirings 140 such as copper (Cu) or the like extend on the protective film 130 from the electrodes 120 to the mounting positions of the terminals 150. The wirings 140 are called "redistribution wirings". The terminals 150 can be set to predetermined positions by routing the wirings 140. Further, a resin encapsulating layer 160 is formed on the protective film 130 so as to cover the wirings 140 and expose the mounting positions of the terminals 150. The terminals 150 are formed so as to protrude from the resin encapsulating layer 160 and electrically connected to their corresponding electrodes 120 through the wirings 140. That is, in the present embodiment, the first surface 101 of the semiconductor device 100 corresponds to the surface of the resin encapsulating layer 160, and the second surface 102 of the semiconductor device 100 corresponds to the back surface of the semiconductor element 110.

The semiconductor device 100 is mounted over the area 220 of the substrate 200 in such a manner that the first surface 101 is opposed to the surface 201 of the substrate 200, i.e., the resin encapsulating layer 160 is placed between the semiconductor element 110 and the surface 201 of the substrate 200.

Here, wirings 210 are formed on the surface 201 of the substrate 200. The terminals 150 of the semiconductor device 100 and the wirings 210 of the substrate 200 are respectively electrically connected.

Further, a heat radiating film 300 is formed over the second surface 102 of the semiconductor device 100 and the area 230 of the substrate 200. The heat radiating film 300 is exposed in an atmosphere such as air.

Thus, heat generated from the semiconductor device 100 is discharged into the atmosphere from the second surface 102 of the semiconductor device 100 via the heat radiating film 300 as indicated by arrows 10 in FIG. 3. Further, the heat is conducted into the substrate 200 via the terminals 150 and discharged into the atmosphere from the surface 201 of the substrate 200 via the heat radiating film 300. That is, the heat generated from the semiconductor device 100 is discharged into the atmosphere through the second surface 102 of the semiconductor device 100 and the surface 201 of the substrate 200.

Thus, the heat radiation of the semiconductor device 100 is sufficiently enabled and hence the reliability of the semiconductor device can greatly be improved.

Further, in the present embodiment, the semiconductor device that needs to be reduced in size is also capable of obtaining sufficient dissipation by mere provision of the thin film. Therefore, the thickness of the semiconductor device can be maintained thin as compared with, for example, a case in which a radiating fin or the like is provided on a semiconductor device to radiate heat.

When a seal 102' such as a product number, which is made by laser or ink or the like is provided on a second surface 102 of a semiconductor device 100 as shown in FIG. 5, a heat radiating film 300 is formed so as to expose the sealed spot of the second surface 102. Thus, the seal can be visually confirmed without executing a complex process, thereby making it possible to reduce the process of confirming the seal.

Here, the heat radiating film 300 may preferably be one having thermal conduction and thermal emission (radiation) to improve heat radiation. With its thermal conductivity, the heat generated from the semiconductor device 100 can be concentrated on the heat radiating film 300. Further, since the heat radiating film 300 has the thermal emission, the concentrated heat can be efficiently discharged into the atmosphere. It is thus possible to obtain high heat dissipation.

Further, the heat radiating film 300 may preferably have an insulating property. The insulating property of the heat radiating film 300 reduces the possibility that the wirings lying in the semiconductor device 100 or the wirings 210 on the substrate 200 will be respectively electrically connected to one another due to the formation of the heat radiating film 300, thus making it possible to maintain the characteristic of the semiconductor device 100. Thus, it may be unnecessary to take into consideration the possibility that the respective wirings will be electrically connected to one another beyond an estimated range at a design stage. Therefore, the heat radiating film 300 can be formed without complex design.

In order to obtain such properties, i.e., the thermal conductivity, thermal emission and insulating property, the heat radiating film 300 makes use of a thermal emission film with ceramics as the material in the present embodiment. Such a thermal emission film has the function of converting given heat into infrared radiation and radiating it and has high heat radiation.

More specifically, a thermal emission film with silica alumina ceramics as the material is used for the heat radiating film 300 in the present embodiment. Thus, the heat radiation can be further improved.

Since the thermal emission film with ceramics as the material is capable of obtaining sufficient heat radiation even if it is thin in thickness, it can sufficiently adapt even to the semiconductor device like the WCSP that needs to be reduced in thickness.

The thickness of the thermal emission film with ceramics as the material may preferably be 30 μm or more. Thus, it is possible to obtain high heat radiation while the strength of the thermal emission film against stress or the like is being maintained sufficiently. In order to obtain high heat radiation while a reduction in the thickness of the semiconductor device is being maintained, the thickness of the thermal emission film may preferably be 200 μm or less.

Further, the heat radiating film 300 is formed so as to cover the wirings 210 formed in the surface 201 of the substrate 200 as shown in FIG. 1 in the present embodiment. Since the wirings 210 are normally made of a metal, they are high in thermal conductivity and apt to transfer or conduct heat produced in the semiconductor device 100. Therefore, the formation of the heat radiating film 300 on the wirings 210 makes it possible to efficiently radiate the heat generated in the semiconductor device 100. Particularly when the wirings 210 are made of copper (Cu), the emission of heat can be carried out more effectively because the thermal conductivity of copper (Cu) is very high.

Further, the heat radiating film 300 (hereinafter called "heat radiating film 300*a*") formed on the second surface 102 of the semiconductor device 100 and the heat radiating film 300 (hereinafter called "heat radiating film 300*b*") formed on the area 230 of the substrate 200 are formed so as to be independent of each other, i.e., be spaced away from each other as shown in FIG. 1 in the present embodiment. Thus, in the present embodiment, the side surfaces 103 of the semiconductor device 100 are exposed from the heat radiating film 300.

According to the present configuration, even when a difference occurs in deformation of each heat radiating film 300 at the interface with the semiconductor device 100 and the interface with the substrate 200 due to the difference in thermal expansion coefficient between the semiconductor device 100 and the substrate 200 when each of the heat radiating films 300 is deformed due to a change in temperature in a heat-treating or annealing step of a manufacturing process and under the environment that it is actually used as a product, as shown in FIG. 4, the possibility that stresses (indicated by arrows 20 and 20' in the figure) developed due to the deformation will interface with each other, is reduced because the heat radiating film 300*a* and the heat radiating film 300*b* are spaced away from each other. Further, the possibility that the stresses developed due to the difference in deformation will concentrate on part, is reduced. Thus, it is possible to reduce the possibility that cracks or the like will occur in each heat radiating film 300 and the possibility that the heat radiating film 300 will be peeled from the semiconductor device 100 or the substrate 200. Consequently, the heat radiation of the semiconductor device 100 can be enhanced and the reliability of the semiconductor device 100 can be greatly improved.

Further, the heat radiating film 300*a* and the heat radiating film 300*b* are formed of the common material in the present embodiment. Thus, for example, the material that constitutes the heat radiating films 300 is supplied from above the substrate 200 by means of a spray to thereby make it possible to form the heat radiating film 300*a* and the heat radiating film 300*b* in batch processing. Hence the number of process steps can be substantially reduced. Thus, the invention of the present application can be realized without a substantial increase in cost.

When the semiconductor device 100 and the substrate 200 are much different in thermal expansion coefficient, the heat radiating film 300*a* and the heat radiating film 300*b* may preferably use materials different in thermal expansion coefficient. That is, the materials different in thermal expansion coefficient are used properly between the heat radiating film 300*a* and the heat radiating film 300*b*, thereby making it possible to set the materials for the respective heat radiating films 300 in such a manner that the stresses developed between the semiconductor device 100 and the heat radiating film 300*a* and between the substrate 200 and the heat radiating film 300*b* are relaxed.

Further, when the stresses developed due to the difference in the thermal expansion coefficient are further reduced, openings 310 may preferably be defined in the heat radiating films 300 as shown in FIG. 5. Thus, since the openings 310 accommodate the stresses, the possibility that cracks will be produced in the heat radiating films 300 due to the stresses, can be further reduced. In the present embodiment, the openings 310 are respectively provided in the heat radiating film 300*a* and the heat radiating film 300*b*. Further, the openings 310 are provided in plural form and disposed with being spaced predetermined intervals from one another. Thus, it is possible to uniformly accommodate the stresses developed in the heat radiating films 300 within layers, reduce the possibility that the stresses will concentrate on part and further reduce the occurrence of cracks.

The openings 310 are provided so as expose the seal 102' where the seal 102' is provided in the second surface 102 of the semiconductor device 100 as described above. Thus, the stresses can also be relaxed while reducing the process for confirming the seal, by mere provision of the openings 310.

SECOND EMBODIMENT

A method of manufacturing a heat radiation structure of the semiconductor device according to the first embodiment will next be described as a second embodiment of the invention of the present application. FIGS. 6 through 10 are process diagrams for describing the second embodiment of the invention of the present application.

Figure 6:
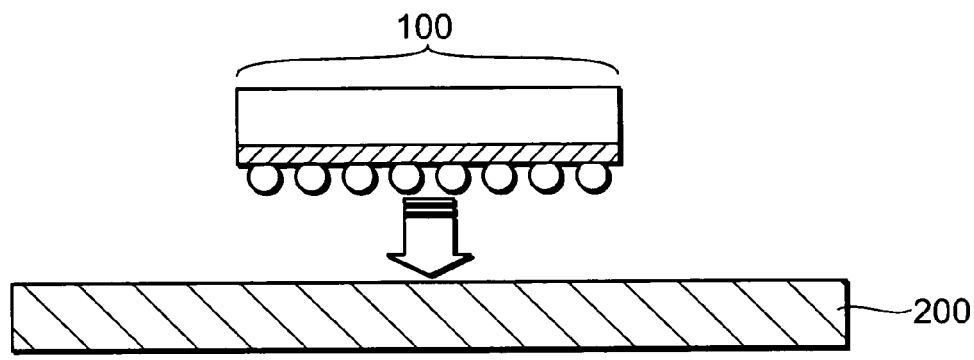
FIG. 6 is a process view for describing a method of manufacturing a heat radiation structure of a semiconductor device according to a second embodiment of the present invention.

In the second embodiment of the invention of the present application, a substrate 200 with a semiconductor device 100 mounted thereon is first prepared as shown in FIG. 6.

Figure 7:
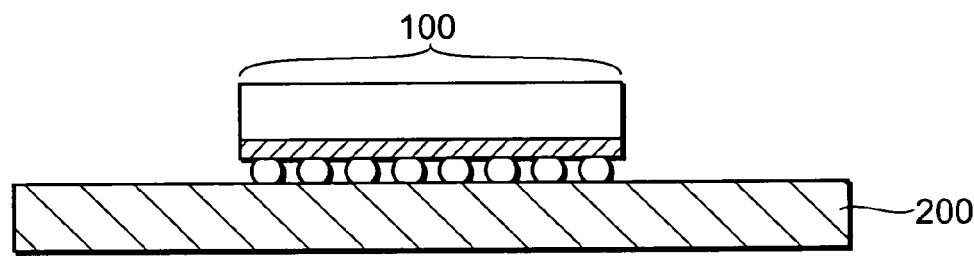
FIG. 7 is a process view for describing the method of manufacturing the heat radiation structure of the semiconductor device according to the second embodiment.

Next, the semiconductor device 100 is mounted over a substrate 200 as shown in FIG. 7.

Figure 8:
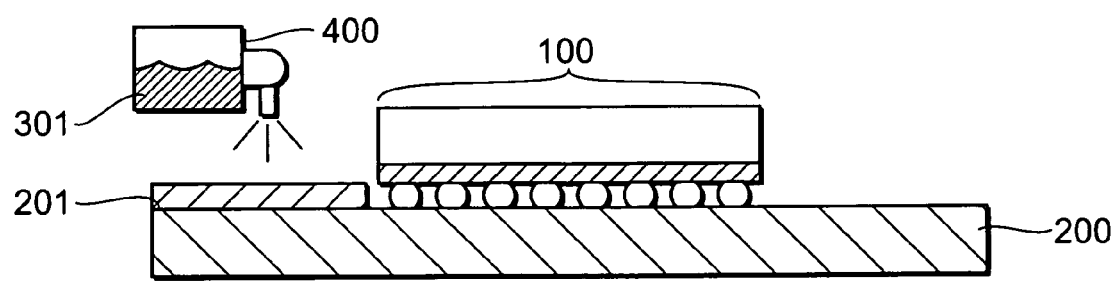
FIG. 8 is a process view for describing the method of manufacturing the heat radiation structure of the semiconductor device according to the second embodiment.
Figure 9:
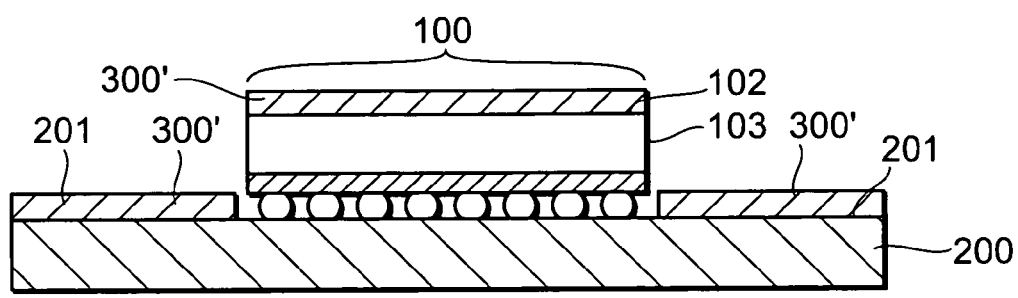
FIG. 9 is a process view for describing the method of manufacturing the heat radiation structure of the semiconductor device according to the second embodiment.

Next, as shown in FIGS. 8 and 9, a liquid heat radiating material 301 is supplied to the surface 201 of the substrate 200 and the surface 102 of the semiconductor device 100 to form a precursor 300' of a heat radiating film 300.

In the present embodiment, liquid ceramics is used for the heat radiating material 301 and sprayed from above the substrate 200 in the form of mist from a supply unit 400 such as a spray. Consequently, the precursor 300' of the heat radiating film 300 is formed on the surface 102 of the semiconductor device 100 and the surface 201 of the substrate 200 so that the side surfaces 103 of the semiconductor device 100 are exposed.

Since the particles of the heat radiating material 301 can be supplied in fines with the heat radiating material 301 being sprayed in mist form, the precursor 300' of the heat radiating film 300 can be supplied to the semiconductor device 100 and the substrate 200 thinly and uniformly. Since the liquid ceramics is fine in particle and low in viscosity, it is particularly suitable for such a supply method.

Spraying the heat radiating material 301 over a wide range in diffused form by means of the spray or the like enables the supply of the heat radiating material 301 to the semiconductor device 100 and the substrate 200 in batch processing. Therefore, the invention can be realized without greatly increasing the number of process steps.

Figure 10:
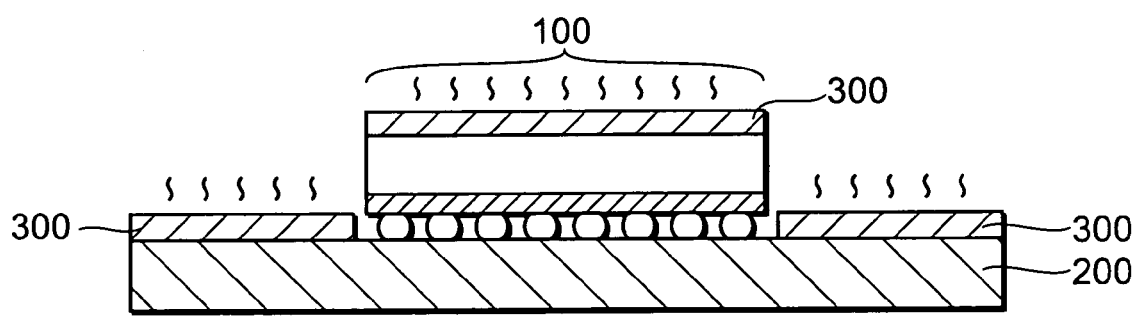
FIG. 10 is a process view for describing the method of manufacturing the heat radiation structure of the semiconductor device according to the second embodiment.

Thereafter, the precursor 300' is heated and cured as shown in FIG. 10 to form the heat radiating film 300. The thickness of the heat radiating film 310 ranges from about 30 μm to about 200 μm. With its heat treatment, the possibility that the heat radiating film 300 will be peeled off out of each of the semiconductor device 100 and the substrate 200.

When other electronic parts of the semiconductor device 100 are mounted over the substrate 200, all of predetermined electronic parts including the semiconductor device 100 are mounted over the substrate 200 and thereafter the heat radiating material 301 is supplied from above the substrate 200 to form the heat radiating film 300 so as to expose the electronic parts. As a result, improvements in the heat radiation of the electronic parts mounted over the substrate 200 can be realized in batch. That is, the reliability of a system configured of a plurality of electronic parts can be greatly enhanced without greatly increasing the number of process steps.

THIRD EMBODIMENT

Figure 11:
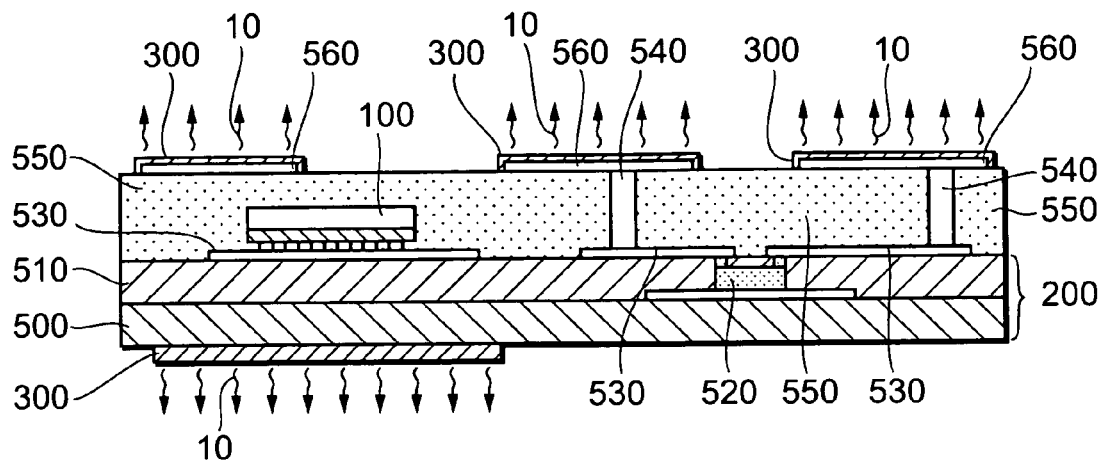
FIG. 11 is a cross-sectional view for describing a heat radiation structure of a semiconductor device according to a third embodiment of the present invention.
Figure 12:
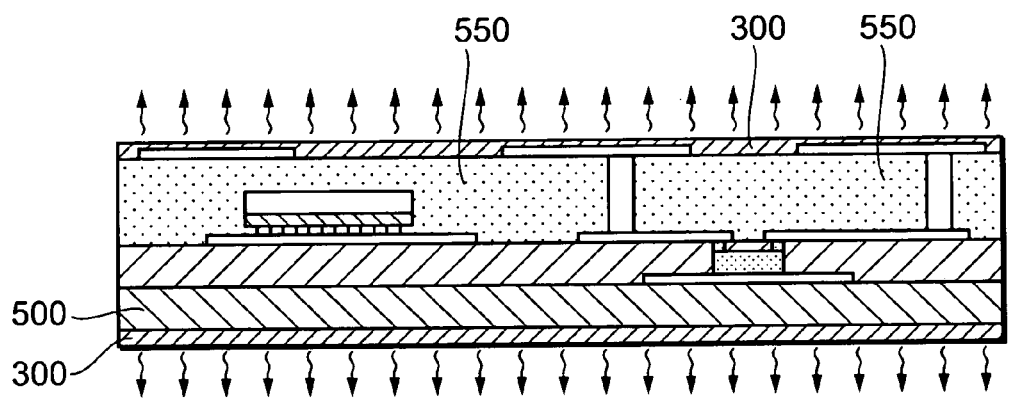
FIG. 12 is a cross-sectional view for describing a modification of the heat radiation structure of the semiconductor device according to the third embodiment.
Figure 13:
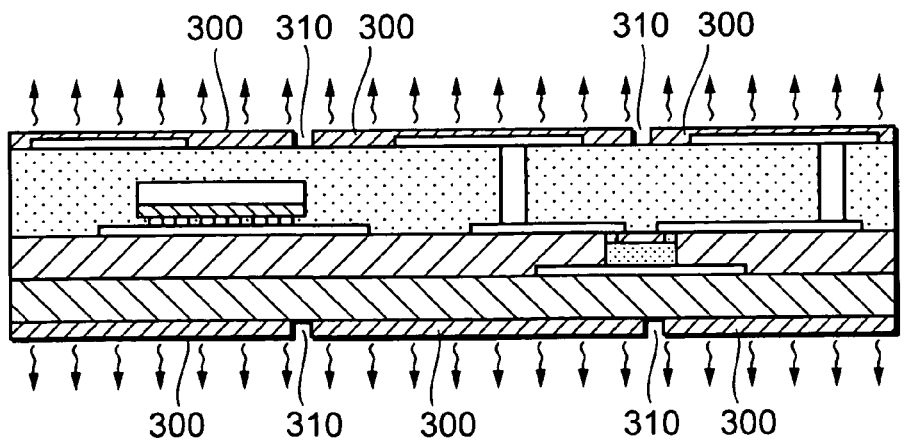
FIG. 13 is a cross-sectional view for describing a modification of the heat radiation structure of the semiconductor device according to the third embodiment.

A further embodiment of a heat radiation structure of a semiconductor device of the invention of the present application will next be explained as a third embodiment. FIG. 11 is a cross-sectional view showing the heat radiation structure of the semiconductor device according to the present embodiment. FIGS. 12 and 13 are respectively cross-sectional views illustrating heat radiation structures of semiconductor devices according to modifications of the present embodiment.

As shown in FIG. 11, the heat radiation structure of the semiconductor device according to the third embodiment of the invention of the present application includes a semiconductor device 100 mounted over a substrate 200. Further, an insulating layer 550 with a resin or the like as the material is formed on the substrate 200 so as to cover the semiconductor device 100.

Thus, such a packaging structure that the electronic parts such as the semiconductor device are embedded in the insulating layer such as the resin formed on the substrate has been existent in recent years. Since the electronic parts such as the semiconductor device are embedded in the insulating layer such as the resin, heat generated from the electronic parts is charged therein in such a packaging structure, thereby causing a possibility that the heat radiation will not be carried out sufficiently. The present embodiment advances a proposal on the heat radiation structure of the semiconductor device, which is capable of improving thermal emission in such a packaging structure.

In the present embodiment, the substrate 200 includes a base substrate 500 and an insulating layer 510 with a resin or the like as the material. An electronic part 520 is mounted over the base substrate 500. The insulating layer 510 is formed on the base substrate 500 so as to cover the electronic part 520.

Wiring patterns 530, which electrically connect the semiconductor device 100 and the electronic part 520, are formed on the substrate 200. Further, conductors 540 respectively electrically connected to the wiring patterns 530 are formed on the substrate 200.

Further, the insulating layer 550 with the resin as the material is formed over the substrate 200 so as to cover the semiconductor device 100 and the wiring patterns 530 and parts of the surfaces of the conductors 540.

Wiring patterns 560, which are electrically connected to the conductors 540 and formed with copper (Cu) or the like as the material, are formed on the insulating layer 550.

Heat radiating films 300 are formed on the insulting layer 550 or the back of the base board 500. Thus, the heat generated from the electronic part 520 or the semiconductor device 100 is conducted into the heat radiating films 300 via the insulating layer 550 or the substrate 200 as indicated by arrows 10 in the figure, followed by being discharged into the atmosphere. Here, a film having a configuration similar to each of the heat radiating films employed in the first embodiment is used as for the heat radiating films 300.

In the present embodiment, the heat radiating films 300 formed on the insulating layer 550 are formed so as to cover the wiring patterns 560. Thus, the heat generated from the electronic part 520 or the semiconductor device 100 is conducted into the wiring patterns 560 via the conductors 540 and radiated from the heat radiating films 300 respectively provided on the wiring patterns 560, thereby making it possible to further enhance heat radiation. That is, since the heat produced from the electronic part 520 or the semiconductor device 100 can be transferred to the heat radiating films 300 with satisfactory efficiency, a further improvement in heat radiation is enabled.

By forming a heat radiating film 300 over the whole surface of an insulating layer 550 or the whole back of a base board 500 as shown in FIG. 12, heat radiation can be further improved.

When there is a need to relax stresses developed due to thermal expansion or the like, heat radiating films 300 may preferably be provided with openings 310 as shown in FIG. 13. According to this configuration, since the stresses are relaxed by means of the openings 310, the possibility that cracks or the like developed due to thermal expansion or the like will occur in the heat radiating films 300, can be reduced while maintaining heat radiation.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A heat radiation structure of a semiconductor device, comprising:
   a substrate having, on a surface thereof, a first area on which the semiconductor device is mounted, and a second area which surrounds the first area; and
   the semiconductor device having a first surface and a second surface opposite to the first surface, the second surface having a periphery, the semiconductor device additionally having a plurality of terminals provided on the first surface,
   wherein the semiconductor device is mounted on the substrate in such a manner that the first surface is opposite to the surface of the substrate,
   wherein a first heat radiating film is disposed on the second area of the substrate, and a second heat radiating film is disposed on the second surface of the semiconductor device but does not extend beyond the periphery of the second surface, with the second heat radiating film being spaced apart from the first heat radiating film;
   wherein the first and second heat radiating films are independent of each other and are disposed at different distances from the substrate; and
   wherein the second heat radiating film has a peripheral edge and a rear side that are exposed to air.

2. A heat radiation structure according to claim 1, wherein the substrate is provided with external electrodes connected to an external board.

3. A heat radiation structure according to claim 1, wherein the substrate is provided with external electrodes connected to an external board, and the semiconductor device is mounted on the substrate in plural form.

4. A heat radiation structure according to claim 1, wherein the substrate includes external electrodes connected to an external board, and the external electrodes are formed on the back of the substrate.

5. A heat radiation structure according to claim 1, wherein wirings are formed on the surface of the substrate, and the terminals of the semiconductor device and the wirings of the substrate are electrically connected to one another.

6. A heat radiation structure according to claim 1, wherein the semiconductor device includes a semiconductor element formed with an electronic circuit and a resin layer formed on the semiconductor element, and the terminals are formed on the resin layer.

7. A heat radiation structure according to claim 1, wherein the surfaces of the first and second heat radiating films are exposed.

8. A heat radiation structure according to claim 1, wherein wirings are formed on the surface of the substrate, and the first heat radiating film is formed so as to cover the wirings.

9. A heat radiation structure according to claim 1, wherein openings are defined in the first heat radiating film, and parts of the surface of the substrate are exposed through the openings.

10. A heat radiation structure according to claim 1, wherein openings are defined in the second heat radiating film, and parts of the second surface of the semiconductor device are exposed through the openings.

11. A heat radiation structure according to claim 1, wherein a seal is applied onto the second surface of the semiconductor device, openings are defined in the second heat radiating film, and the openings are provided such that the seal is exposed.

12. A heat radiation structure according to claim 1, wherein the thickness of each of the first and second heat radiating films ranges from 30 µm to 200 µm.

13. A heat radiation structure according to claim 1, wherein the first and second heat radiating films respectively comprise a common material.

14. A heat radiation structure according to claim 1, wherein the first heat radiating film and the second heat radiating film are different in thermal expansion coefficient.

15. A heat radiation structure according to claim 1, wherein a film having an insulating property is used for the first and second heat radiating films.

16. A heat radiation structure according to claim 1, wherein a thermal emission film having thermal radiation is used for the first and second heat radiating films.

17. A heat radiation structure according to claim 1, wherein the material for the first and second heat radiating films is ceramics.

18. A heat radiation structure according to claim 1, wherein the material for the first and second heat radiating films is silica alumina ceramics.

19. A heat radiation structure of a semiconductor device, comprising:
   a substrate with the semiconductor device mounted on the surface thereof; and
   the semiconductor device, which includes a first surface, a second surface opposite to the first surface and having a periphery and a plurality of side surfaces provided between the first surface and the second surface, the semiconductor device being provided with a plurality of terminals on the first surface,
   wherein the semiconductor device is mounted on the substrate in such a manner that the first surface is opposite to the surface of the substrate,
   wherein a first heat radiating film is disposed on the substrate adjacent the semiconductor device,
   wherein a second heat radiating film is disposed on the second surface of the semiconductor device without extending beyond the periphery of the second surface, and exposes the side surfaces of the semiconductor device, the second heat radiating film being independent of the first heat radiating film,
   wherein the second heat radiating film has a peripheral edge and a rear side that are exposed to air, and
   wherein the first and second heat radiating films are disposed at different distances from the substrate.

20. A heat radiating structure according to claim 19, wherein the heat radiating film is made of ceramic material.

21. A heat radiation structure in combination with a semiconductor device with a wafer level chip size package, the semiconductor device having a first surface with terminals and having a second surface with a periphery, the second surface of the semiconductor device being oriented opposite the first surface, said heat radiation structure comprising:
   a substrate having, on a surface thereof, a first area and a second area adjacent the first area, the semiconductor device being mounted on the first area of the substrate with the first surface of the semiconductor device facing the substrate, the semiconductor device covering the first area;
   a first heat radiating film on the substrate in the second area; and
   a second heat radiating film disposed on the second surface of the semiconductor device without extending beyond the periphery of the second surface and without overlapping the first heat radiating film, the second heat radiating film being independent of the first heat radiating film and having a peripheral edge and a rear side that are exposed to air, wherein the first and second heat radiating films are disposed at different distances from the substrate.

22. A combination according to claim 21, wherein the first heat radiating film is made of ceramic material.

23. A combination according to claim 21, wherein the second heat radiating film is made of ceramic material.

24. A combination according to claim 21, wherein the first and second heat radiating films are made of ceramic material.

25. A heat radiating structure according to claim 1, wherein the first heat radiating film is thinner than the semiconductor device, and has a rear side that is exposed to air.

26. A heat radiating structure according to claim 21, wherein the first heat radiating film is thinner than the semiconductor device, and has a rear side that is exposed to air.

* * * * *